United States Patent [19]

Tanaka et al.

[11] Patent Number: 5,423,503
[45] Date of Patent: Jun. 13, 1995

[54] PLATE-LIKE MEMBER CONVEYING APPARATUS

[75] Inventors: Susumu Tanaka; Takanobu Asano; Hisashi Kikuchi; Noboru Sato, all of Tokyo, Japan

[73] Assignee: Tokyo Electron Sagami Limited, Kanagawa, Japan

[21] Appl. No.: 56,918

[22] Filed: May 5, 1993

Related U.S. Application Data

[63] Continuation-in-part of Ser. No. 785,506, Oct. 30, 1991, Pat. No. 5,273,244.

[51] Int. Cl.⁶ .......................................... H01L 21/00
[52] U.S. Cl. ............................. 248/176; 248/295.1; 211/1.57
[58] Field of Search ............... 248/176, 277, 295.1, 248/244, 125; 211/1.57, 187

[56] References Cited

U.S. PATENT DOCUMENTS

| 2,779,990 | 2/1957 | Van Den Bos | 248/277 X |
| 3,940,174 | 2/1976 | Mayes | 211/1.57 X |
| 4,168,006 | 9/1979 | Yamamoto | 248/277 |

FOREIGN PATENT DOCUMENTS 55-33027  3/1980  Japan .

*Primary Examiner*—Alvin C. Chin-Shue
*Attorney, Agent, or Firm*—Oblon, Spivak, McClelland, Maier, & Neustadt

[57] ABSTRACT

A plate-like member conveying apparatus includes five holding arms arranged parallel to each other in one direction and capable of supporting wafers, a link mechanism for connecting said holding arms to each other and for, when at least one holding arm is moved in the one direction, moving the remaining holding arms such that the pitch thereamong is equal, and a nut-screw driving mechanism for moving the at least one holding arm in the one direction.

32 Claims, 9 Drawing Sheets

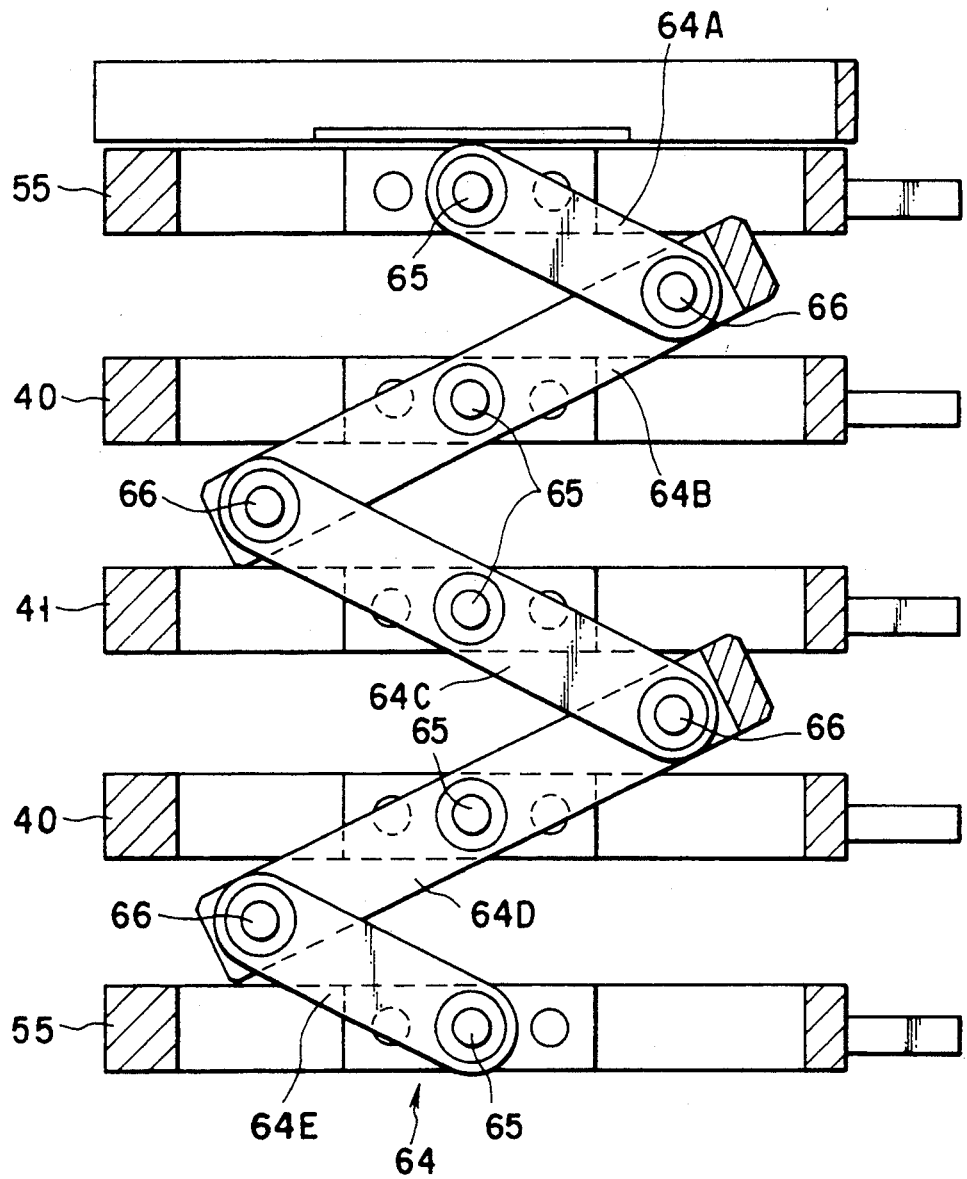
F I G. 10

PLATE-LIKE MEMBER CONVEYING APPARATUS

CROSS-REFERENCES TO THE RELATED APPLICATIONS

This application is a continuation-in-part, of U.S. patent application Ser. No. 785,506, filed on Oct. 30, 1991 U.S. Pat. No. 5,273,244, issued Dec. 28, 1993.

BACKGROUND OF THE INVENTION

1. Field of the Invention

The present invention relates to a plate-like member conveying apparatus.

2. Description of the Related Art

In semiconductor manufacturing steps and the like, various types of plate-like member conveying apparatuses have been used as an apparatus for conveying plate-like members such as semiconductor wafers.

For example, Published Unexamined Japanese Patent Application No. 64-35746 discloses a plate-like member conveying apparatus in which five arms for supporting semiconductor wafers are arranged such that semiconductor wafers are vertically arranged at equal intervals to be substantially parallel to each other. In this apparatus, a plurality of ball screws having different leads and directions are formed on a rotatable shaft, and nuts are arranged on the proximal end portions of the arms to oppose these ball screws. The proximal end portions of the arms are respectively attached to the ball screws. When the shaft is rotated, the arms are translated to change the pitch of the semiconductor wafers.

In such a plate-like member conveying apparatus, a transfer operation can be performed while the pitch of a plurality of semiconductor wafers is changed. For example, the apparatus is used to transfer semiconductor wafers between a wafer cassette and a wafer boat for a heat-treatment apparatus. The transfer operation is automatically performed in accordance with the control of the program previously set in the computer.

In the above-described conventional plate-like conveying apparatus, however, since metal ball screws and metal nuts which are engaged with each other are used, if the shaft is rotated a large number of times to change the interval between plate-like members, the ball screws and the nuts are brought into slidable contact with each other to generate a large amount of dust, e.g., metal dust and the mist of a lubricating oil. Such dust is scattered, and some of the scattered dust adheres to the surfaces of semiconductor wafers, resulting in an increase in rejection rate of semiconductor devices. Especially in recent years, with an increase in integration density of a semiconductor device, there has been a great need to suppress the generation of even only a little dust. Therefore, the generation of dust poses a serious problem.

SUMMARY OF THE INVENTION

The present invention has been made in consideration of the above situation, and has as its object to provide a plate-like member conveying apparatus which can reduce the amount of generated dust, e.g., metal dust and oil mist, as compared with a conventional apparatus.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5 to 10 show a plate-like member conveying apparatus according to another embodiment of the present invention, in which FIG. 5 is a perspective view of the apparatus FIG. 6 is a sectional view taken along line A—A of FIG. 5, FIG. 7 is a plan view, FIG. 8 is a view showing mechanism for adjusting the angle of a fork, FIG. 9 is a view showing a mechanism for controlling movement of hold plates, and FIG. 10 is a view showing a link mechanism for shifting the hold plates.

An apparatus according to a first embodiment of the present invention will be described below with reference to FIGS. 1 and 2.

The apparatus of this embodiment is designed to change the intervals between arms 2a to 2e by using two translating mechanisms 64 including two link mechanisms, and a screw shaft 56.

Figure 1:
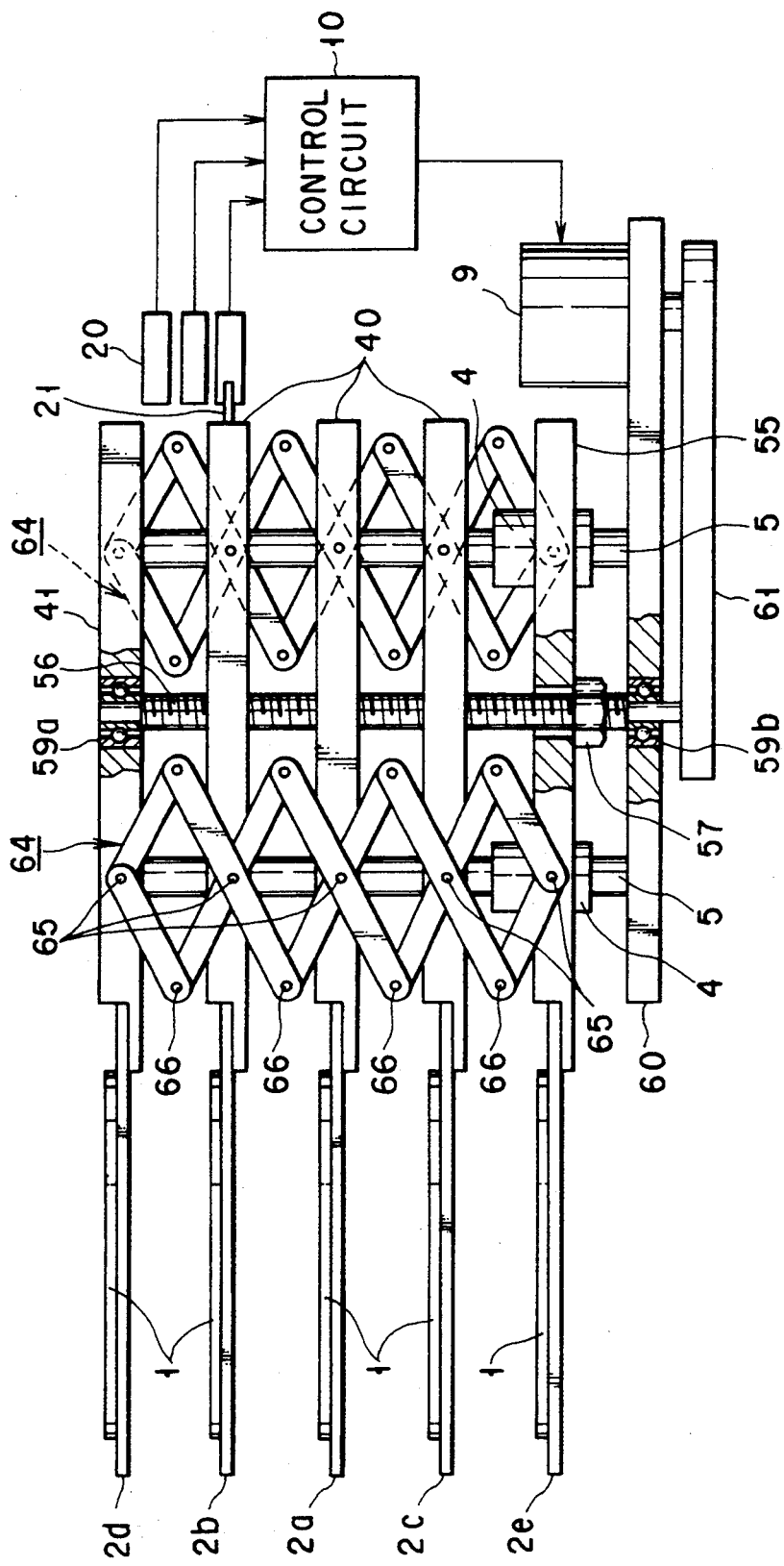
FIG. 1 is a partially cutaway side view showing a plate-like member conveying apparatus according to an embodiment of the present invention.
Figure 2:
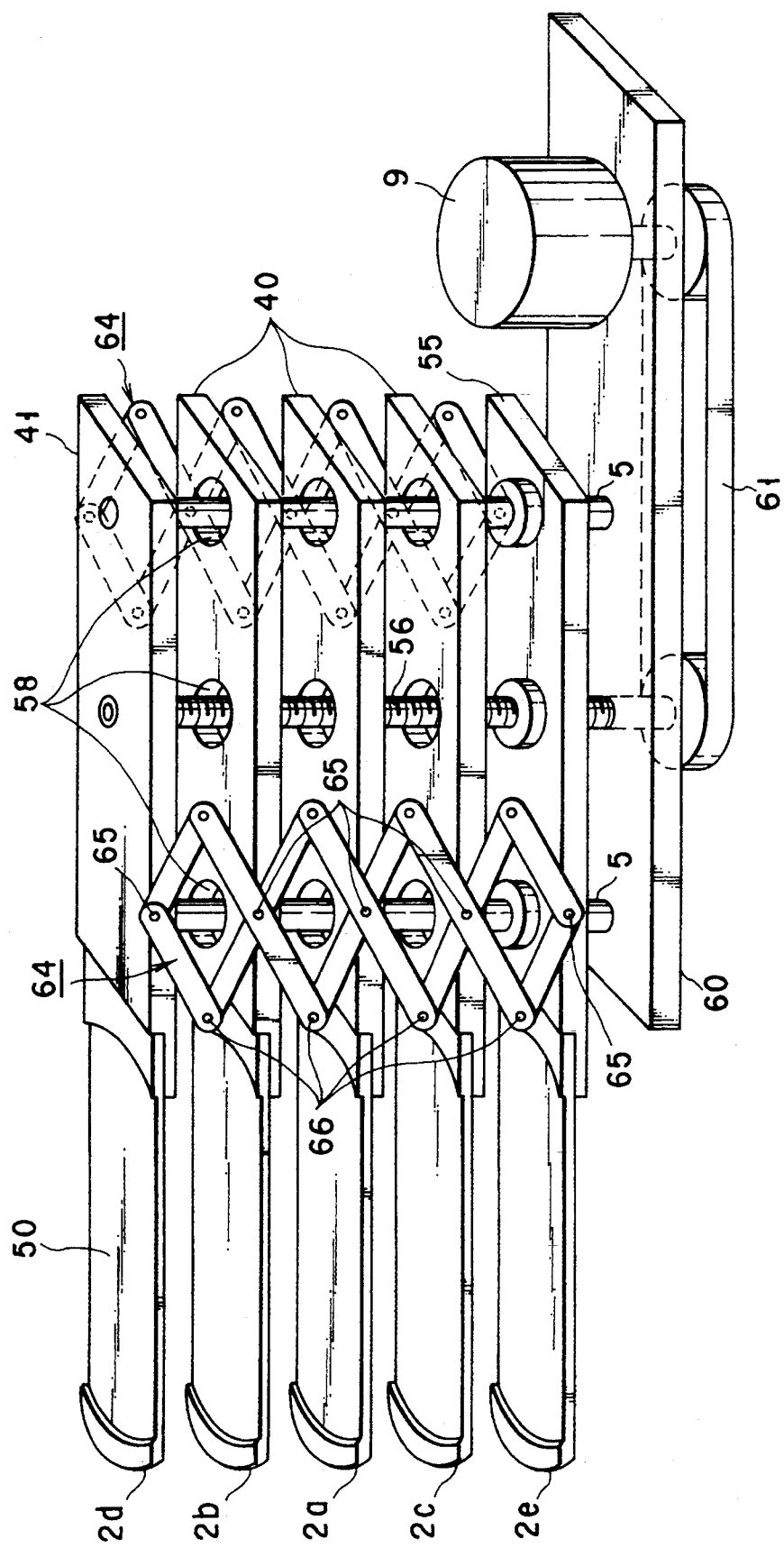
FIG. 2 is a perspective view showing the plate-like member conveying apparatus shown in FIG. 1.

As shown in FIG. 1, a movable plate 55 is arranged at the proximal end of a lowermost arm 2e. A nut 57 to be engaged with a screw shaft 56 is fixed at a central portion of the movable plate 55. On the two sides of the nut 57, two linear sliders 4 are attached to the plate 55, to be fitted on round rods 5. There moving plates 40 are respectively arranged at the proximal ends of three arms 2a, 2b, and 2c arranged at intermediate positions. As shown in FIG. 2, three holes 58 are formed in each moving plate 40. The round rods 5 and the screw shaft 56 are loosely inserted through these holes 58. The upper end portions of the two round rods 5 are fixed to a stationary plate 41 which is attached to one end of the uppermost arm 2d and fixed on a housing (not shown). A bearing 59a is arranged at a central portion of the stationary plate 41, and the upper end of the screw shaft 56 is rotatably supported by the bearing 59a.

A base 60 is arranged below the movable plate 55. The lower end portions of the two round rods 5 are fixed and supported on the base 60. A bearing 59b is fixed in the base 60. A lower axle portion of the screw shaft 56 is rotatably supported by this bearing 59 in such a manner that its lower end portion extends downward from the base 60.

A motor 9 is arranged on the proximal end side of the base 60. A rotating shaft of this motor 9 extends downward from the base 60. An endless belt 61 is looped around pulleys fixed to the rotating shaft of the motor 9 and the lower end portion of the screw shaft 56.

Two translating mechanisms 64, each including a link mechanism constructed by ten link arms, are fixed on the opposite elongated sides of the plates, i.e., the movable plate 55. Three moving plates 40, and the stationary plate 41, with shafts or pins 65 provided for crossing portions of the link arms.

Ball bearings (not shown) are respectively provided for the above-mentioned central crossing portions and end crossing portions of the link arms which are pivoted by pins 6b, so that the respective link arms of the mechanisms 64 can be smoothly rotated about the crossing portions 65 and 66.

As described above, in the embodiment, by using a moving means constituted by the screw shaft 56, the nut 57, and the motor 9, the intervals of the arms supported by the two translating mechanisms 64 can be freely and continuously changed while the arms are kept at equal intervals. Therefore, a simple, low-cost plate-like member conveying apparatus can be provided. In addition, since only one pair of the screw shaft 56 and the nut 57 is used, only a small amount of dust is generated. This prevents a decrease in yield of semiconductor elements, which tends to occur when dust adheres to a conveyed wafer.

As shown in FIG. 1, three optical sensors 20, each consisting of light-emitting and light-receiving elements, are arranged on one side of the moving plate 40 attached to the arm 2b. These optical sensors 20 are electrically connected to the motor 9 through a control circuit 10. A light-shielding plate 21 is arranged on one side of the moving plate 40 so as to shield light from the light-emitting element of a corresponding one of the optical sensors 20. When the outer arm 2b is moved to predetermined positions and the light-shielding plates 21 enter the optical sensors 20, optical changes in the optical sensors 20 are supplied, as changes in electrical signal, to the control circuit. The control circuit then controls the rotation of the motor 9. As a result, the moving plate 55 can be reliably stopped at predetermined positions.

Figure 3:
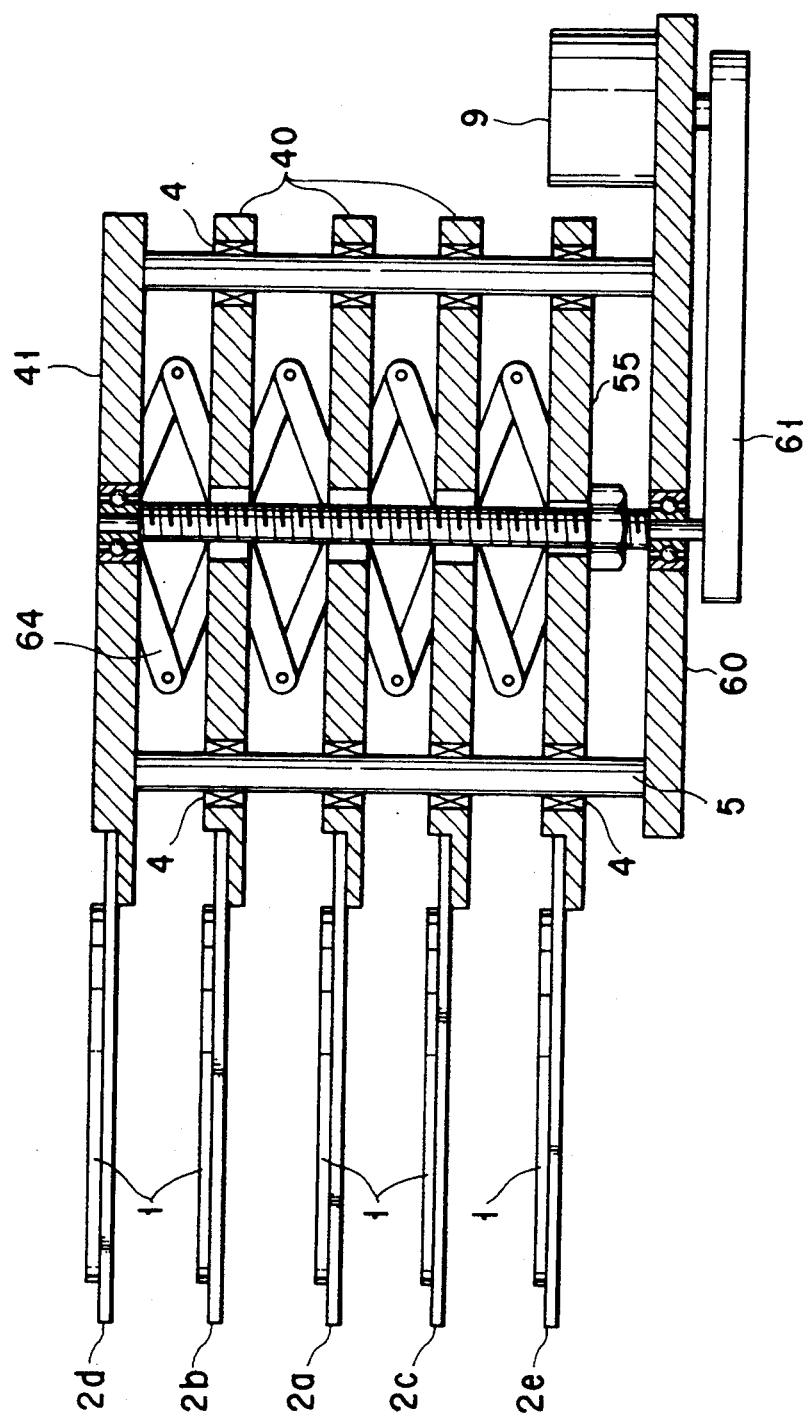
FIG. 3 is a sectional view showing a modification of the plate-like member conveying apparatus shown in FIG. 1.

Note that if only one translating mechanism 64 is used as shown in FIG. 3, the arrangement of the apparatus can be further simplified.

Figure 4:
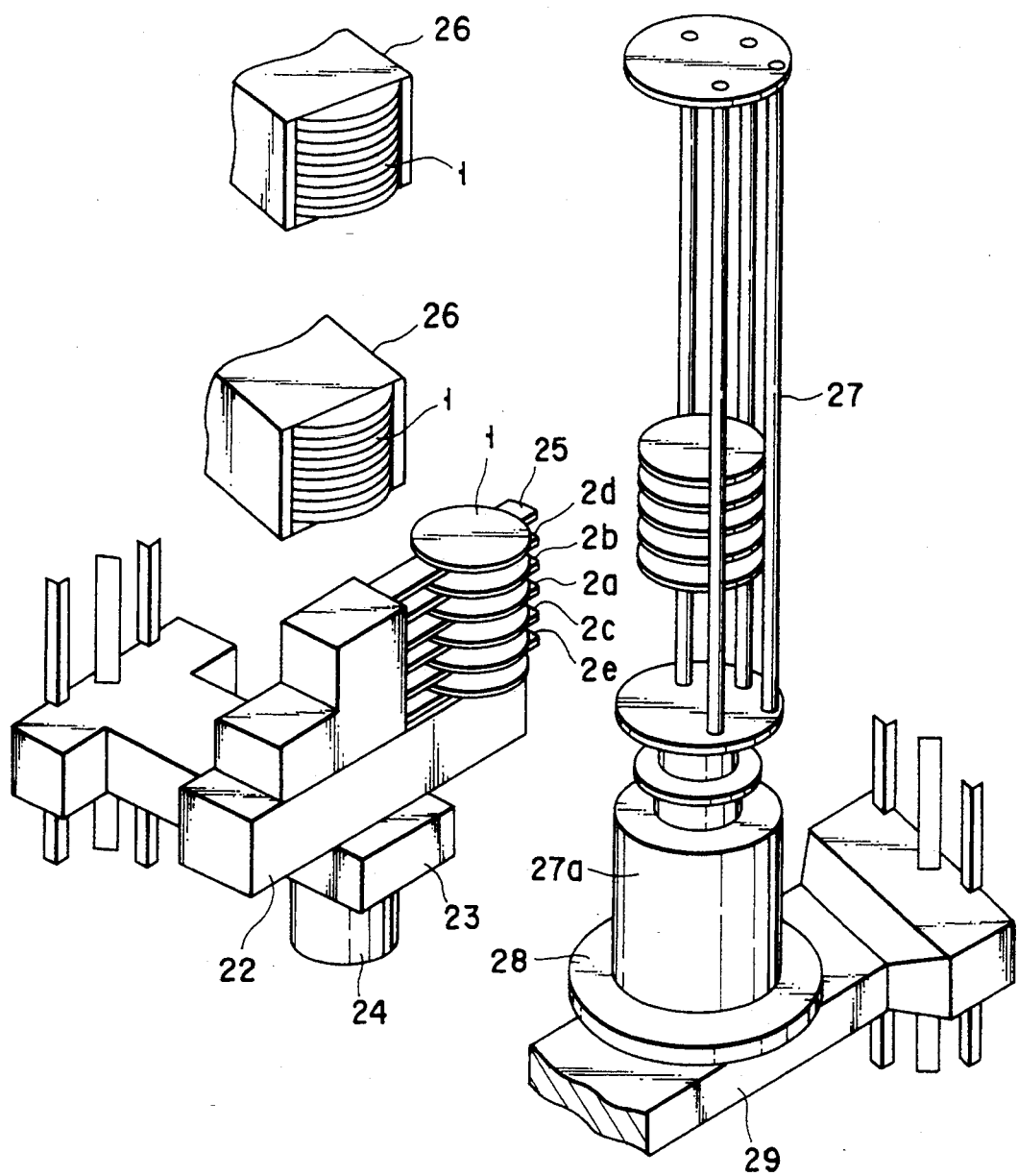
FIG. 4 is a perspective view of a system for explaining a practical arrangement of the plate-like member conveying apparatus.

As shown in FIG. 4, the mechanism having the abovedescribed arrangement is arranged on a horizontally driving mechanism 22 for linearly moving the mechanism forward and backward, an elevating mechanism 23 for vertically moving the mechanism, and a horizontally rotating mechanism 24 for horizontally rotating the mechanism. A single wafer transfer arm 25 for transferring a single wafer is arranged above the arms 2a to 2e of the above-described mechanism so as to be moved independently of the arms 2a to 2e, thereby constituting the plate-like conveying apparatus of this embodiment.

As described above, this plate-like conveying apparatus is designed to transfer the semiconductor wafers 1 between a wafer carrier 26 and a heat-treatment wafer boat 27 (to be simply referred to as a wafer boat hereinafter) of a vertical type heat-treatment apparatus. The wafer pitch of this wafer carrier 26 is 3/16 inches, and 25 semiconductor wafers 1 are stored at this pitch in the wafer carrier 26. The wafer pitch of the wafer boat 27 is 9/16 inch, and 150 semiconductor wafers 1 are stored at this pitch in the wafer boat 27. The apparatus changes the intervals of the semiconductor wafers 1 so as to transfer the wafers 1 between the wafer carrier 26 and the wafer boat 27.

The wafer boat 27 is composed of a heat-resistant material such as quartz and is to be placed in a furnace (to be described later). The wafer boat is mounted on a holding base 27a. This holding base 27a is arranged on a wafer boat elevating mechanism 29 through a thin disk-like lid member 28. The wafer boat 27 can be vertically moved by this wafer boat elevating mechanism 29.

A furnace (not shown) is arranged above the wafer boat 27. In this furnace, temperature setting can be properly performed within the range of, e.g., 500 to 1,200° C. The furnace has a soaking region at a predetermined position. In addition, an opening is formed in a lower portion of the furnace. The wafer boat 27 is loaded in the furnace from this opening by the boat elevating mechanism 29, and the opening is completely sealed with the lid member 28. As a result, the semiconductor wafers 1 stored in the boat 27 are placed in the soaking region of the furnace, and the furnace is tightly sealed.

Operation of the plate-like member conveying apparatus according to this embodiment will be described below.

The motor 9 is driven to rotate the screw shaft 56, thus setting the intervals between the arms 2a to 2e to coincide with the wafer pitch (3/16 inches) of the wafer carrier 26. In this state, the frame of the conveying apparatus is moved to a position close to the wafer carrier 26 by using the horizontally driving mechanism 22, the elevating mechanism 23, and the horizontally rotating mechanism 24, and the arms 2a to 2e are inserted in the wafer carrier 26 to be respectively located below the lower surfaces of the semiconductor wafers 1.

Subsequently, the arms 2a to 2e are slightly raised at a predetermined distance by the elevating mechanism 23 so that the semiconductor wafers 1 in the wafer carrier 26 are mounted on the arms 2a to 2e one by one (a total of five wafers). Thereafter, the arms 2a to 2e are removed from the wafer carrier 26 and are moved to a position in front of the wafer boat 27.

The motor 9 is rotated at a predetermined amount to change the wafer pitch of the arms 2a to 2e to the wafer pitch (9/16 inches) of the wafer boat 27. The arms 2a to 2e are then inserted in the wafer boat 27 at predetermined positions. Thereafter, the arms 2a to 2e are lowered by the elevating mechanism 23. Thus, a predetermined number of semiconductor wafers 1, e.g. the five wafers 1 are transferred simultaneously. By repeating the same operation, all of the semiconductor wafers 1 in the wafer carrier 26 are transferred to the wafer boat 27.

In a heat-treatment process, dummy wafers are sometimes arranged at upper and lower portions of the wafer boat 27, or a monitor wafer may be arranged between a predetermined number of semiconductor wafers 1. In such a case, semiconductor wafers are transferred one by one by using the single wafer transfer arm 25. After the heat treatment is completed, the treated semiconductor wafers 1 are transferred from the wafer boat 27 to the wafer carrier 26 in a reverse procedure to that described above.

As described above, according to this embodiment, the pitch of the semiconductor wafers 1 is changed by the racks link mechanism 64. Therefore, in comparison with, e.g., a case wherein ball screws are used, the number of revolutions of the motor 9 required to change the wafer pitch can be reduced, and the amount of generated dust can be decreased. In addition, the size of the apparatus can be reduced.

An apparatus according to another embodiment of the present invention will be described with reference to FIGS. 5 to 10.

Figure 5:
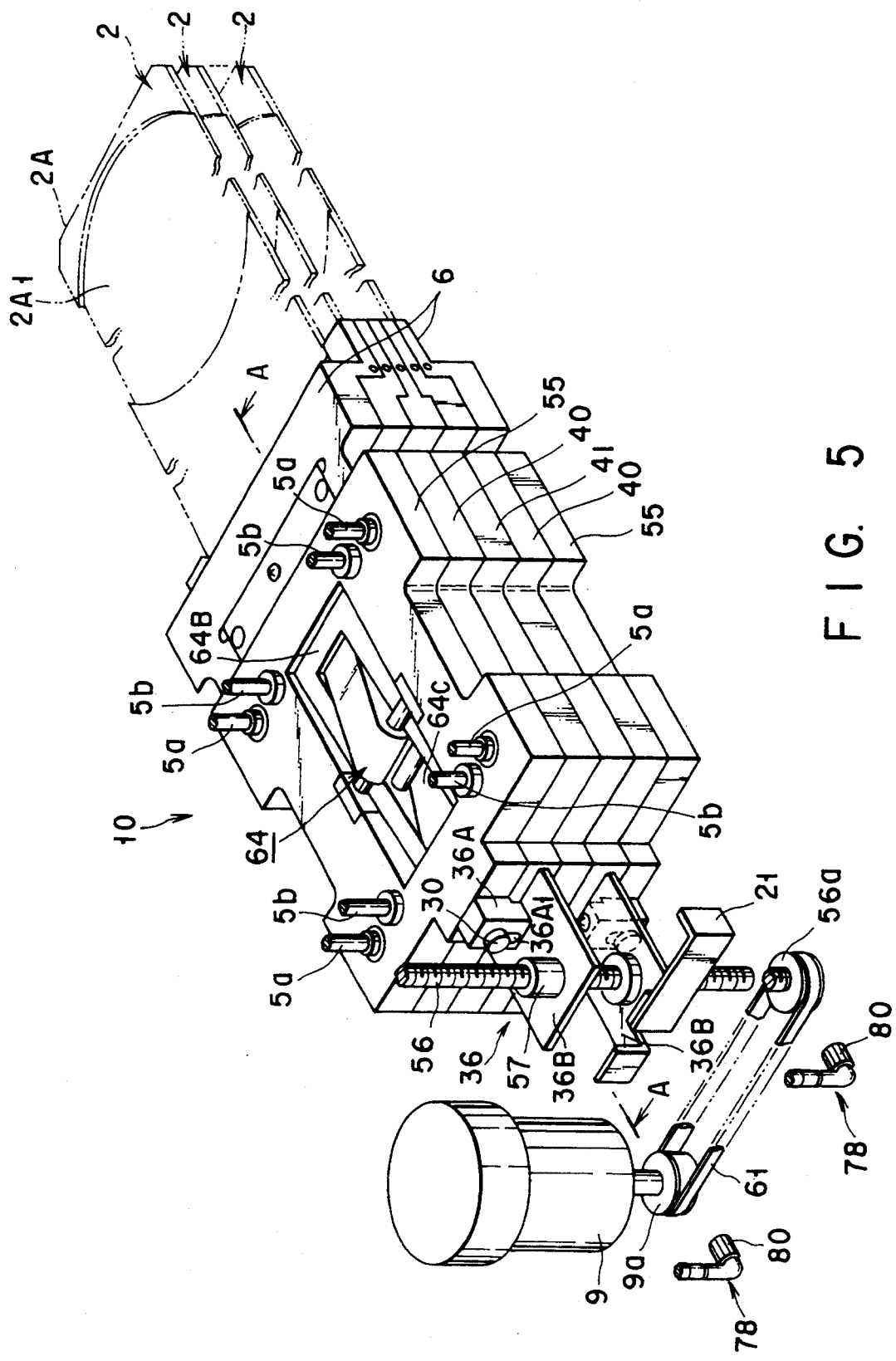

FIG. 5 is a perspective view schematically showing the overall arrangement of the plate-like member conveying apparatus according to another embodiment of the present invention.

Referring to FIG. 5, a plate-like member conveying apparatus 10 is housed in a housing 100 (see FIG. 6) and has an odd number of hold plates arranged in the vertical direction. In this embodiment, a total of five holding plates, i.e., two driving holding plates 55, two driven holding plate 40, and one stationary holding plate 41 are arranged parallel to each other in the vertical direction.

The stationary holding plate 41 located at the center in the direction along which the five holding plates are arranged is fixed to the apparatus body or housing at the center in the plate-like member conveying apparatus in the direction of height. Hence, the stationary holding plate 41 is not movable in the vertical direction.

Figure 6:
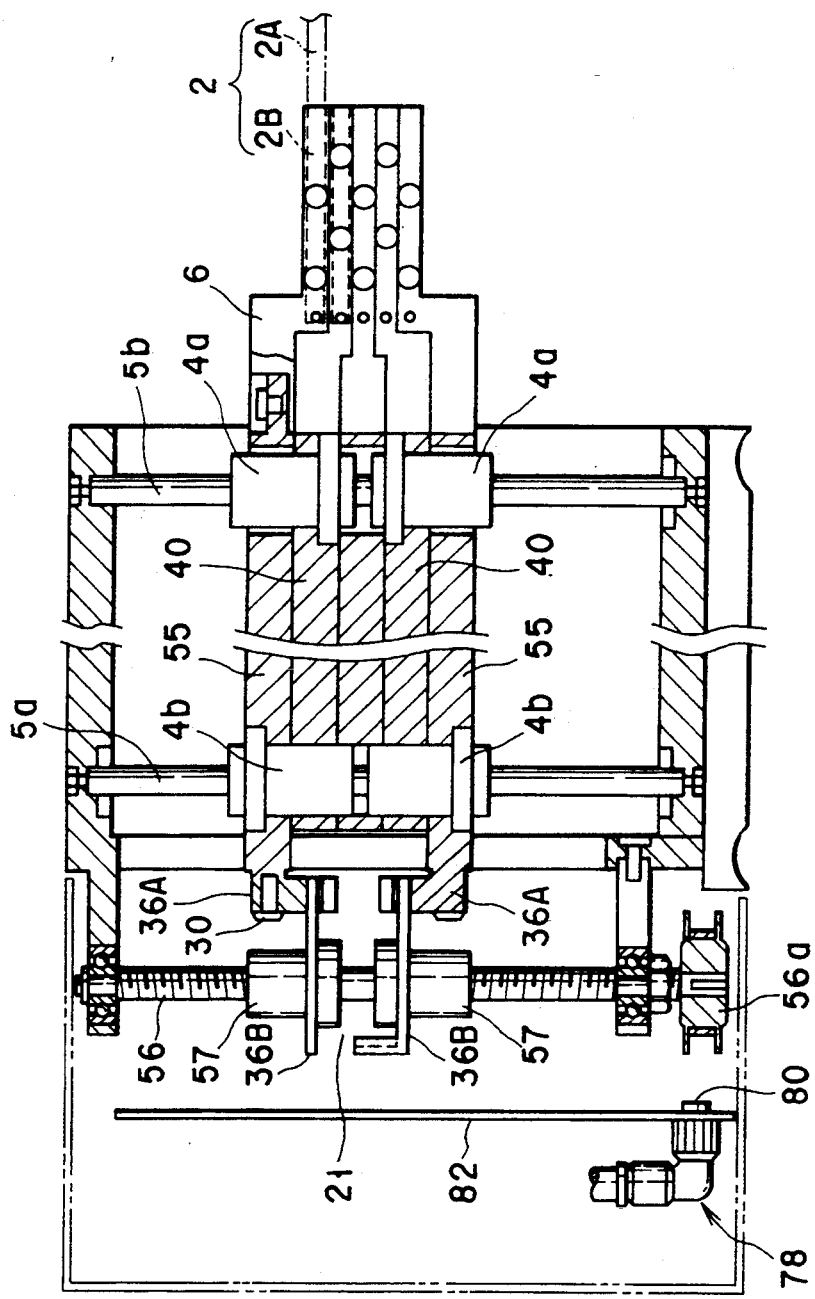

The remaining holding plates 40 and 55 are movable in the vertical direction as they are guided by guide shafts 5a and 5b. The pair of guide shafts 5a and 5b are arranged at each of the four corners of the hold plates. As shown in FIG. 6, of each pair of guide shafts 5a and 5b, one guide shaft 5a is provided to slide the driving holding plates 55, of the holding plates, which are located at the two sides of the direction along which the holding plates are arranged, i.e., at the highest and lowest positions. The other guide shaft 5b is provided to slide the driven holding plates 40 located between the driving holding plates 55 and the stationary holding plate 41. Hence, as shown in FIG. 6, linear guides 4b fixed to the driving holding plates 55 are fitted on one guide shaft 5a, and linear guides 4a fixed to the driven holding plates 40 are fitted on the other guide shaft 5b. Each linear guide is longer than the thickness of the corresponding holding plate in order to stabilize movement. Holes not interfering with the linear guides 4a and 4b are formed in the remaining stationary holding plate 41.

A fork or arm 2 is attached to one end of each holding plate to place and holding a plate-like member, e.g., a semiconductor wafer, thereon. Each fork 2 has a thin plate-like wafer rest portion 2A made of, e.g., alumina (Al$_2$O$_3$) and a base portion 2B for fixing the wafer rest portion 2A. A recess portion 2A1 is formed in the upper surface of the wafer rest portion 2A to lock the circumferential edge of the semiconductor wafer with its periphery. The base portion 2B is placed on an attaching base plate 6 (to be described later), and its side surfaces are clamped by the attaching base plate 6.

Figure 7:
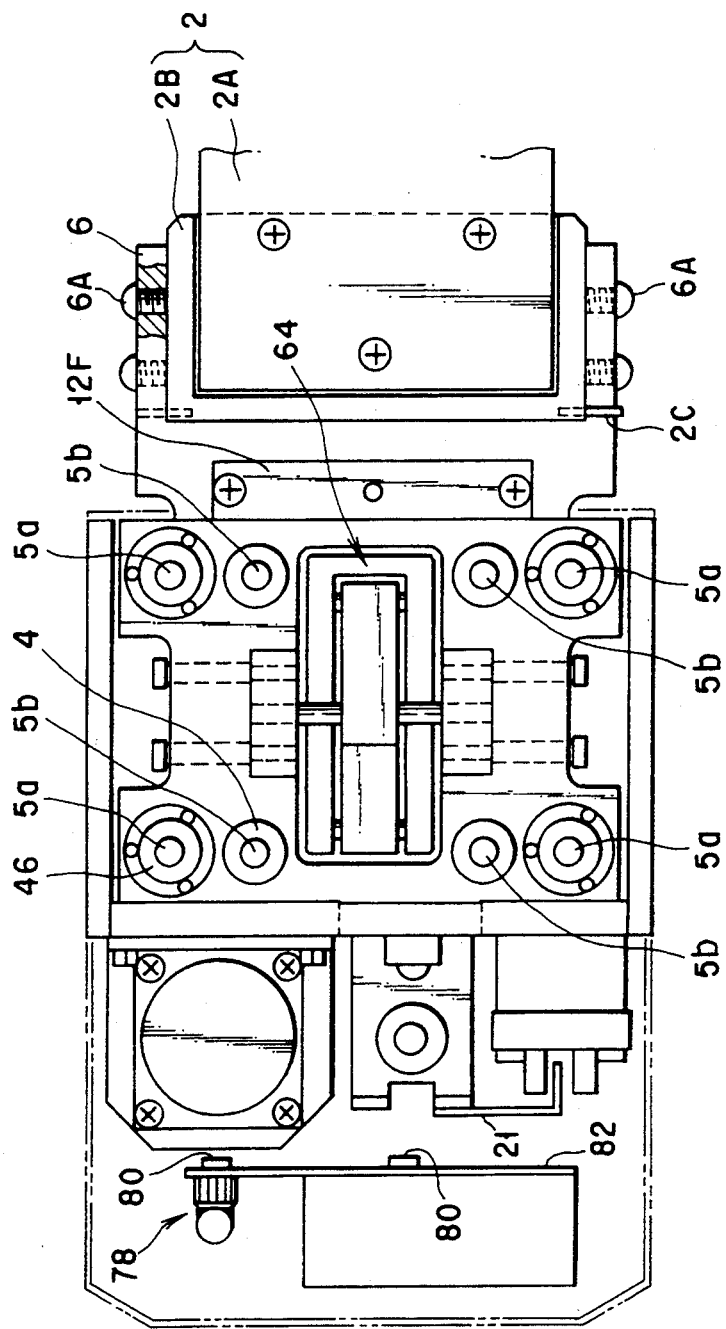
Figure 8:
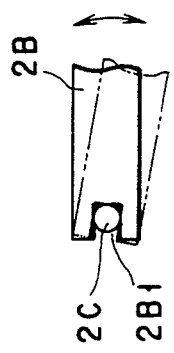

As shown in FIG. 7, each attaching base plate 6 is a U-shaped frame member when seen from above, and is integrally attached to the corresponding holding plate as it is clamped to a tongue piece 12F formed on the distal end of the holding plate. The side surfaces and distal end of the base portion 2B of each fork 2 contact a pair of opposing sides of the corresponding attaching base plate 6, and bolts 6A for clamping the fork 2 are screwed in the opposing sides of the attaching base plate 6. An angle adjusting mechanism for the fork 2 is provided to the base portion 2B. The adjusting mechanism serves to adjust the inclination of the base portion 2B with respect to the horizontal plane, thereby maintaining the base portion 2B horizontally. For this purpose, as shown in FIG. 8, a groove 2B1 is formed in the proximal end face of the base portion 2B of the fork 2, and the distal end portions of pins 2C inserted from the opposing sides of the attaching base plate 6 are disposed in the grooves 2B1. Accordingly, when the clamp force on the two sides of the fork 2 by the bolts 6A is decreased, the fork 2 can swing about the pins 2C as the fulcrum, so that the fork 2 can be adjusted in the horizontal state regardless of the preset angle of the corresponding holding plate.

As shown in FIG. 5, each attaching base plate 6 has a small thickness on its fork side, so that the interval or pitch of the forks 2 can be decreased.

Each holding plate has a structure, on its end portion opposing the corresponding fork 2, to move the holding plate in the vertical direction.

More specifically, the structure for moving the holding plate has driven means 36 and a driving means 38.

Each driven means 36 has a holding bracket 36A located on the rear end face of the corresponding driving holding plate 55 and a support plate 36B fixed to the holding bracket 36A. The central portion of a bolt 30 is inserted in the holding bracket 36A. The distal end of the bolt 30 is screwed in the rear end face of the corresponding driving holding plate 55. An elongated hole 36A1 extending in the vertical direction is formed in the holding bracket 36A. As the rear end face of the hold bracket 36A is pushed by the rear end head portion of the bolt 30, the holding bracket 36A is fixed to the driving holding plate 55. The elongated hole 36A1 serves to adjust the initial positions of the driven means 36 and the driving means 38. When the bolt 30 inserted in the elongated hole 36A1 is loosened, the holding bracket 36A can be displaced in the vertical direction. Although not shown, stoppers for setting a predetermined interval, i.e., the interval of the support plates in an overlapping state in this case, are attached to the opposing surfaces of the support plates 36B.

A light-shielding member 21 is fixed to the support plate 36B mounted on the lower driven means 36. The light-shielding member 21 is used for setting the pitch of the holding plates by the driving means 38, which will be described later in detail.

The driving means 38 has a driving screw 56 and a rotational driving means 9 for rotating the driving screw 56. The driving screw 56 extends in the vertical direction, and as shown in FIG. 6, its two end portions are rotatably supported by the stationary portions of the apparatus by bearings. Lead portions are formed on opposite sides of the driving screw 56 with respect to the central portion of the driving screw 56 as the boundary in the axial direction corresponding to the center of the apparatus in the direction of height. The lead portions have opposite lead directions and the same lead amounts.

Ball nuts 57 mounted on the corresponding support plates 36B are threadably engaged with the lead portions of the driving screw 56. Hence, upon rotation of the driving screw 56, the ball nuts 57 are vertically moved in the opposite directions to move the driven means 36 by the same distances in the opposite directions. A driven pulley 56a is mounted on one end of the driving screw 56 in the axial direction. An endless belt 61 is looped between the driven pulley 56a and a driving pulley 9a provided to a pulse motor constituting the rotational driving means 9, so that the rotating force of the pulse motor is transmitted to the driven pulley 56a.

The driving holding plates 55 have structures for moving the driven holding plates 40 located between them in the interlocked manner when the driving holding plates 55 are displaced, such that the driven holding plates 40 are parallel to each other at the same pitch.

As shown in FIG. 7, a rectangular opening is formed in each holding plate at the central portion between one end where the fork 2 is located and the other end where the driven means 36 is located. A translating means 64 is provided within this opening.

As shown in FIG. 10, the translating means 64 is a link mechanism having a plurality of link arms 64A, 64B, 64C, 64D, and 64E constituted by connecting a plurality of arms with pins 66 at different levels. One end portion of the first link arm 64A and one end portion of the fifth link arm 64E are pivotally supported on the corresponding driving holding plates 55 by pins 65. The central portion of the second link arm 64B and the central portion of the fourth link arm 64D are pivotally supported on the corresponding driven holding plates 40 by pins 65. The central portion of the third link arm 64C is pivotally supported on the stationary holding plate 41 by pins 65. In the translating means 64, the two ends of each of its outer link arms 64B and 64D formed in the U-shaped manner when seen from above, and the two ends of each of the link arms 64A, 64C and 64E located in an area defined by the link arms 64B and 64D are pivotally supported by the pins 66. Hence, the link arms can be extended and contracted. In this embodiment, the first, third, and fifth link arms 64A, 64C, and 64E are located on the inner side, and the second and fourth link arms 64B and 64D are formed in the U-shaped manner. With this arrangement, when the translating means 64 is contracted to bring the holding plates into tight contact with each other, the link arms do not intersect each other, so they do not interfere with each other.

This link mechanism can be extended or contracted about the pivotal point of the third link arm 64C as the fulcrum. Upon being extended or contracted, the vertical displacement occurring in the central portion of a link is transmitted to the corresponding holding plate.

Suction ports 80 connected to vacuum mechanisms 78 are provided in the vicinities of the driven and driving pulleys 56a and 9a to oppose them. The suction ports 80 are fixed to, e.g., a wire harness mounting wall 82 (FIG. 6) provided in the apparatus.

This embodiment has a structure for changing the pitch of the forks 2. More specifically, when the pitch of the forks 2 is to be changed, the new pitch is sometimes matched with the storing pitch of the boat and cassette in accordance with the specifications of semiconductor wafers. In this embodiment, three different pitches, e.g., 3/5b inch, 6/5b inch, and 9/5b inch are selected.

Figure 9:
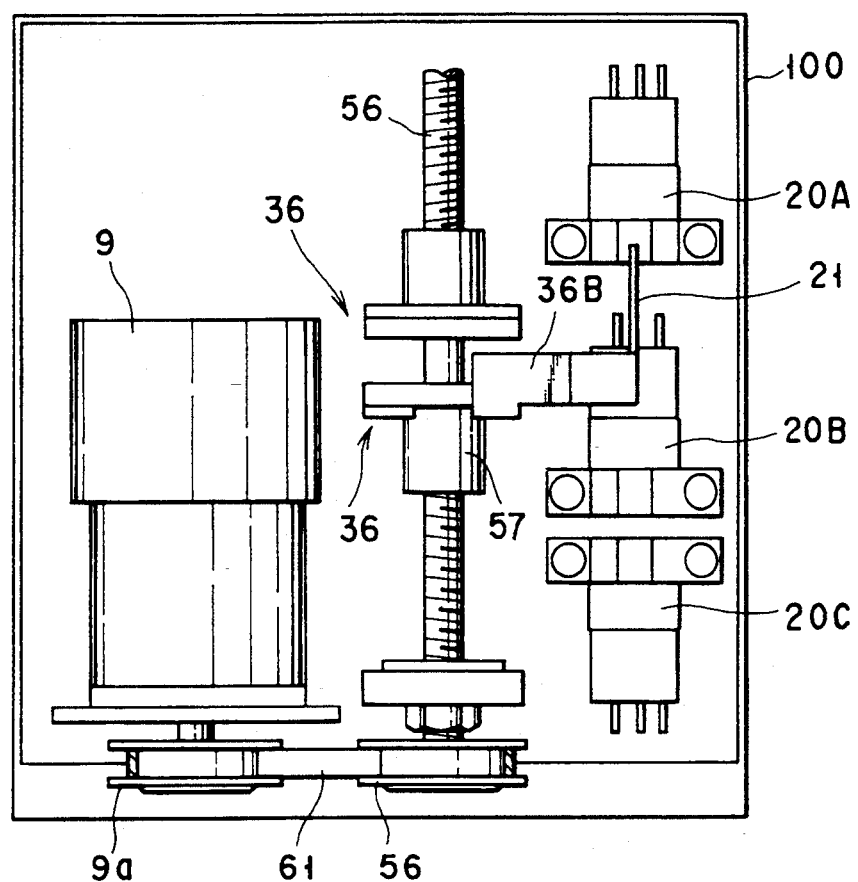

Hence, as shown in FIG. 9, this embodiment has the light-shielding member 21 of the support plate 36B fixed to the lower driven means 36 (nut 57), an origin sensor 20B located on the path of the light-shielding member 21, and upper- and lower-limit sensors 20A and 20C vertically arranged above and below the origin sensor 20B. These sensors have the same structure as those described in the above embodiment. Upon shielding the optical path of the origin sensor 20B by the light-shielding member 21, predetermined pulses are supplied to the pulse motor serving as the rotational driving means 9 through a control circuit, thereby setting the pitches described above. The upper- and lower-limit sensors 20A and 20C are provided to detect overrun of the driven means 36. When the sensors 20A and 20C detect that the driven means 36 pass them, power supply to the rotational driving means 9 is immediately stopped.

The operation of this embodiment will be described.

To assemble the plate-like member conveying apparatus 10, the overlapping driving holding plates 55 are coupled to the central portions of the links of the translating means 64 and selectively mounted on the linear guides 4b and 4a. Of the holding plates, the stationary holding plate 41 located at the center in the direction along which the holding plates are arranged is fixed to the stationary portion of the apparatus, and the highest and lowest driving holding plates 55 are coupled to the holding brackets 36A of the driven means 36 through the bolts 30. The guide shafts 5a and 5b fixed in the apparatus body are inserted in the linear guides 4b and 4a, and the ball nuts 57 fixed to the support plates 36B of the driven means 36 are threadably engaged with the driving screw 56. At this time, the bolts 30 are loosened to adjust the vertical position of the holding brackets 36A, thereby performing initial position adjustment of the driven means 36 with respect to the driving screw 56.

Regarding the fork 2 for placing a plate-like member, e.g., a semiconductor wafer, thereon, its wafer rest portion 2A is fixed to its base portion 2B, and the base portion 2B is mounted to the corresponding hold plate through the attaching base plate 6, so that the fork 2 is integrally attached to the corresponding hold plate. At this time, the inclination of the fork 2 can be corrected by pivoting it about the pins 2C, fitted in the grooves 2B1 of the base portion 2B, as the fulcrum. Thus, the extending direction of the fork 2 is horizontally maintained.

To set the pitch of the forks 2 of the holding plates in accordance with the placing pitch of the plate-like members to be conveyed, the number of driving pulses to be supplied to the pulse motor serving as the rotational driving means 9 is selected in advance. The rotational driving means 9 starts rotation from the previously stopped position, and the driven means 36 are shifted by rotation of the rotational driving means 9. Then, upon shielding the optical path of the origin sensor 20B by the light-shielding member 21, the rotational driving means 9 rotates for an amount corresponding to the preset number of driving pulses. Therefore, when rotation of the rotational driving means 9 is transmitted to the driving screw 56 through the driven and driving pulleys 56a and 9a, the driving screw 56 displaces the pair of driving holding plates 55 by the same distances in the opposite directions through the ball nuts 57 and the driven means 36. At this time, for example, as shown in FIG. 10, the link arms 64A to 64E of the translating means 64 are extended to set the pitch of the forks 2.

The pitch of the forks 2 is not fixed, but is sometimes changed, e.g., during conveyance.

More specifically, in an annealing apparatus, if the pitch of placing the semiconductor wafers in the cassette is different from the pitch of placing the semiconductor wafers in the boat, after the semiconductors are extracted from the cassette or boat, the pitch of the forks 2 must be set to match the placing pitch in the board or cassette. For this purpose, in this embodiment, for example, the pulse motor serving as the rotational driving means 9 is rotated upon rotation of the arm mechanism, and the optical path of the origin sensor 20B is shielded by the light-shielding member 21 of the driven means 36. At this time point, a rotational amount corresponding to a predetermined pulse count is set in the rotational driving means 9. Accordingly, as the driving screw 56 is rotated, the driven means 36 are moved in the opposite directions to set the forks 2 at the predetermined pitch.

As has been described above, according to this embodiment, of an odd number of holding plates, if the number of holding plates located between the stationary one at the central portion and the highest one, and the number of holding plates located between the stationary one at the central portion and the lowest one are set equal to each other, when the highest and lowest holding plates are displaced, the in-between holding plates can be smoothly displaced while minimizing the load acting on them.

Only the holding plates located between the central one and the highest and lowest ones must be moved in the interlocked manner. Therefore, the driving length of the holding plates to be moved in the interlocked manner can be short, thereby decreasing a pitch error.

In this embodiment, five holding plates are arranged. However, the number of holding plates can be of an odd number other than five. If a large number of holding plates are arranged, not only the highest and lowest holding plates are driven. Additional holding plates can be provided in the upper and lower levels within a range that allows an error caused by the arrangement of the links.

The plate-like member conveying apparatus according to the present invention can be utilized not only in an annealing apparatus but also in various steps of a semiconductor manufacturing apparatus and a liquid crystal manufacturing apparatus. It can also be applied to a CVD apparatus, a plasma processing apparatus, a carrier stocker apparatus, a boat stocker apparatus, and the like.

The translating means 64 described in this embodiment may have a structure capable of changing the distance between the central and end portions of a link. In this case, a plurality of levels of engaging grooves may be formed in, e.g., the end portion of an arm in the longitudinal direction, and the position of the fulcrum axis may be changed by selectively moving a projection member, e.g., a solenoid into the engaging grooves. When the swing radii of the links are changed in this manner, a driving torque, an amplification factor for obtaining a pitch, and the like are selected to set optimum pitch changing conditions.

As has been described above, according to the apparatus of this embodiment, in batch conveyance of plate-like members, the pitch of the arrangement can be continuously changed. More specifically, the holding plates are provided with the driving means capable of changing the rotational amount, the driven members engaged with the driving means, and the translating means for moving the holding plates parallel to each other while maintaining the same pitch. Of the odd number of holding plates, one located at the center is stationary. In driving, the holding plates on the two sides of the direction along which the holding plates are arranged are driven by the driving means. Hence, when the holding plates on the two sides of the direction along which the holding plates are arranged are driven in accordance with the preset rotational amount of the driving means, the holding plates located between the central portion and one side of the direction along which the holding plates are arranged can be moved, together with those located between the central portion and the other side, by the same distances in the opposite directions.

According to the present invention, the fork portion and the driven member are provided to one and the other ends of a holding plate, respectively. A notched portion is formed in the intermediate portion between these end portions, and the translating means is arranged in this notch. When arms located between the highest and central holding plates and arms located between the lowest and central holding plates, of the whole holding plates, are to be moved in the interlocked manner, they can be moved, at the central position of the surface of the holding plate, in the vertical direction along which the holding plates are arranged. Thus, the holding plates can be smoothly displaced only by providing a minimum number of translating means.

The fork portion and the driven member of each holding plate are respectively provided with the adjusting mechanisms. The correspondence among the holding plates can be optimized by adjusting the angles of the fork portions and the positions of the driving means.

In this embodiment, the highest and lowest holding plates are driven by the driving mechanism. However, other movable holding plates may be driven.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A plate-like member conveying apparatus comprising: at least three holding plates arranged parallel to each other in a vertical direction and horizontally supporting plate-like members thereon;

link means for connecting said holding plates to each other and for, when at least one holding plate is moved in the vertical direction, moving the remaining holding plates such that a pitch thereamong is equal; and a single driving means for moving said at least one holding plate in the vertical direction.

2. An apparatus according to claim 1, wherein said driving means comprises a rotatable shaft extending in the vertical direction to extend through said holding plates and having a male screw, a female screw provided to said at least one holding plate and threadably engaged with said male screw, and means for rotating said shaft.

3. An apparatus according to claim 1, which comprises means for detecting movement of said drive holding means in the vertical direction to control said driving means.

4. An apparatus according to claim 1, wherein said link means comprises a plurality of link arms pivotally connected in a zigzag manner, wherein said link arms are pivotally supported by corresponding holding plates of said at least three holding plates.

5. An apparatus according to claim 4, wherein said link arms comprise a link arm having an opening and a link arm inserted in the opening.

6. An apparatus according to claim 1, which comprises a detecting mechanism which detects an amount of movement of said driven holding plate in the vertical direction to control said driving mechanism.

7. An apparatus according to claim 1, wherein said link mechanism comprises a plurality of link arms pivotally connected in a zigzag manner, wherein said link arms are pivotally supported by corresponding holding plates of said at least three holding plates.

8. An apparatus according to claim 4, wherein said link arms comprise a link arm having an opening and a link arm inserted in the opening.

9. A plate-like member conveying apparatus comprising:
- a plurality of plate-like members;
- driving holding means, at least one driven holding means, and stationary holding means that are arranged parallel to each other in the vertical direction and respectively supporting said plate-like members;
- link means for connecting said driving, driven, and stationary holding means to each other and for, when one driving holding means is moved in the vertical direction, moving said driven holding means such that a pitch among said driving, driven, and stationary holding means is equal; and
- driving means for moving said driving holding means in the one direction.

10. An apparatus according to claim 9, wherein said link means has at least one link mechanism having a plurality of link arms having crossing sections pivotally supported by said driving, driven, and stationary holding means, and pivotal support portions that are pivotally supported on each other.

11. An apparatus according to claim 10, which comprises at least three driven holding means arranged between said stationary and driving holding means.

12. An apparatus according to claim 11, wherein said driving means comprises a shaft, extending in the vertical direction to extend through said driving and driven holding means, rotatably supported by said stationary holding means, and having a male screw, a female screw provided to said driving holding means and threadably engaged with said male screw, and means for rotating said shaft.

13. An apparatus according to claim 9, which comprises means for detecting movement of said driven holding means in the vertical direction to control said driving means.

14. An apparatus according to claim 11, wherein said driving mechanism comprises a shaft, extending in the vertical direction to extend through said driving and driven holding mechanisms, rotatably supported by said stationary holding mechanism, and having a male screw, a female screw provided on said driving holding mechanism and threadably engaged with said male screw, and a mechanism rotating said shaft.

15. A plate-like member conveying apparatus comprising:
- a plurality of plate-like members;
- stationary holding means arranged parallel to each other in a vertical direction and supporting said plate-like members;
- at least two upwardly movable holding means and at least two downwardly movable holding means that are respectively located above and below said stationary holding means;
- link means for connecting said stationary and movable holding means to each other and for, when one downwardly movable holding means and one upwardly movable holding means are moved in opposite directions, moving remaining movable holding means in the vertical direction such that a pitch among said movable and stationary holding means is equal; and
- driving means for moving said movable holding means in the vertical direction.

16. An apparatus according to claim 15, wherein said movable holding means moved by said driving means comprise said movable holding means located at the uppermost position and said movable holding means located at the lowermost position.

17. (Amended) An apparatus according to claim 16, wherein said link means has a plurality of link arms pivotally connected in a zigzag manner, and corresponding holding means for pivotally supporting said link arms.

18. An apparatus according to claim 17, wherein said link arms comprise a link arm having an opening and a link arm inserted in the opening.

19. An apparatus according to claim 5, wherein said holding means have connecting portions to which said link means is connected, support portions mounted on said connecting portions and supporting the plate-like members, and adjusting means for adjusting angles of said support portions with respect to said connecting portions.

20. An apparatus according to claim 15, wherein said holding plates have connecting portions to which said link means is connected, support portions mounted on said connecting portions and supporting the plate-like members thereon, and adjusting means for adjusting angles of said support portions with respect to said connecting portions.

21. An apparatus according to claim 17, wherein said link arms comprise a link arm having an opening and a link arm inserted in the opening.

22. An apparatus according to claim 15, wherein said holding plates have connecting portions to which said link mechanism is connected, support portions mounted on said connecting portions and supporting the plate-like members thereon, and an adjusting mechanism which adjusts angles of said support portions with respect to said connecting portions.

23. A plate-like member conveying apparatus comprising:
- at least three holding plates arranged parallel to each other in a vertical direction and horizontally supporting plate-like members thereon;
- a link mechanism connecting said holding plates to each other and, when at least one holding plate is moved in the vertical direction, moving the remaining holding plates such that a pitch thereamong is equal; and
- a single driving mechanism for moving said at least one holding plate in the vertical direction.

24. An apparatus according to claim 23, wherein said driving mechanism comprises a rotatable shaft extending in the vertical direction to extend through said holding plates and having a male screw, a female screw provided to said at least one holding plate and threadably engaged with said male screw, and a rotating mechanism for rotating said shaft.

25. A plate-like member conveying apparatus comprising:
- a plurality of plate-like members;
- a driving holding mechanism, at least one driven holding mechanism, and a stationary holding mechanism that are arranged parallel to each other in the vertical direction and respectively supporting said plate-like members;

a link mechanism for connecting said driving, driven, and stationary holding mechanisms to each other and, when one driving holding mechanism is moved in the vertical direction, moving said driven holding mechanism such that a pitch among said driving, driven, and stationary holding mechanisms is equal; and a driving mechanism moving said driving holding means in the one direction.

26. An apparatus according to claim 25, wherein said link mechanism has at least one link assembly having a plurality of link arms with crossing sections pivotally supported by said driving, driven, and stationary holding mechanism, and pivotal support portions that are pivotally supported on each other.

27. An apparatus according to claim 26, which comprises at least three driven holding mechanism arranged between said stationary and driving holding mechanism.

28. An apparatus according to claim 25, which comprises a mechanism detecting movement of said driven holding mechanism in the vertical direction to control said driving mechanism.

29. A plate-like member conveying apparatus comprising:

a plurality of plate-like members;

stationary holding mechanisms arranged parallel to each other in a vertical direction and supporting said plate-like members;

at least two upwardly movable holding mechanisms and at least two downwardly movable holding mechanisms means that are respectively located above and below said stationary holding mechanisms;

a plurality of link mechanisms connecting said stationary and movable holding mechanisms to each other and, when one downwardly movable holding mechanisms and one upwardly movable holding mechanisms are moved in opposite directions, moving remaining movable holding mechanisms in the vertical direction such that a pitch among said movable and stationary holding mechanisms is equal; and a driving mechanism moving said movable holding mechanisms in the vertical direction.

30. An apparatus according to claim 29, wherein said movable holding mechanisms moved by said driving mechanism comprise said movable holding mechanism located at the uppermost position and said movable holding mechanism located at the lowermost position.

31. An apparatus according to claim 30, wherein said link mechanisms comprise a plurality of link arms pivotally connected in a zigzag manner, and a corresponding holding mechanism for pivotally supporting said link arms.

32. An apparatus according to claim 29, wherein said holding mechanisms have connecting portions to which said link mechanisms are connected, support portions mounted on said connecting portions and supporting the plate-like members, and adjusting mechanisms which adjust plates of said support portions with respect to said connecting portions.

* * * * *